US008074193B2

(12) United States Patent
Sotiriou et al.

(10) Patent No.: US 8,074,193 B2
(45) Date of Patent: Dec. 6, 2011

(54) APPARATUS AND METHOD FOR MIXED SINGLE-RAIL AND DUAL-RAIL COMBINATIONAL LOGIC WITH COMPLETION DETECTION

(75) Inventors: Christos P. Sotiriou, Crete (GR); Pavlos Mattheakis, Crete (GR); Michail Christofilopoulos, Crete (GR)

(73) Assignee: Institute of Computer Science (ICS) of the Foundation for Research & Technology Hellas-Foundation for Research and Technology Hellas (FORTH), Heraklion, Crete (GR)

( * ) Notice: Subject to any disclaimer, the term of this patent is extended or adjusted under 35 U.S.C. 154(b) by 342 days.

(21) Appl. No.: 12/402,265

(22) Filed: Mar. 11, 2009

(65) Prior Publication Data

US 2010/0231261 A1    Sep. 16, 2010

(51) Int. Cl.
    *G06F 17/50*    (2006.01)
(52) U.S. Cl. ....................................................... 716/105
(58) Field of Classification Search ........................ None
    See application file for complete search history.

(56) References Cited

U.S. PATENT DOCUMENTS

| | | | | |
|---|---|---|---|---|
| 6,496,041 | B2 * | 12/2002 | Hirairi | 326/113 |
| 6,526,542 | B2 * | 2/2003 | Kondratyev | 716/103 |
| 6,946,878 | B2 * | 9/2005 | Kunemund | 326/98 |
| 6,950,959 | B2 * | 9/2005 | Davies et al. | 713/500 |
| 6,970,016 | B2 * | 11/2005 | Elbe et al. | 326/86 |
| 7,584,449 | B2 * | 9/2009 | Beerel et al. | 716/104 |
| 7,603,635 | B2 * | 10/2009 | Sotiriou et al. | 716/103 |
| 7,870,516 | B2 * | 1/2011 | Sotiriou et al. | 716/103 |
| 2006/0239392 | A1 * | 10/2006 | Cummings et al. | 375/372 |
| 2009/0037853 | A1 | 2/2009 | Sotiriou et al. | |

OTHER PUBLICATIONS

Cheng et al., "A Robust Handshake for Asynchronous System," Proc. of 3rd IEEE Int'l Workshop on System-on-Chip for Real-Time Applications, 2003 IEEE Computer Society, 4 pages.*

Cho et al., "On Single/Dual-Rail Mixed PTL/Static Circuits in Floating Body SOI and Bulk Cmos: A Comparative Assessment," Proc. of 16th Int'l Conference on VLSI Design, 2003 IEEE Computer Society, 6 pages.*

Cheng et al., "A New Robust Handshake for Asymmetric Asynchronous Micro-Pipelines," 2003 IEEE, pp. 209-212.*

Matsubara et al., "A Low Power Zero-Overhead Self-Timed Division and Square Root Unit Combining a Single-Rail Static Circuit with a Dual-Rail Dynamic Circuit," 1997 ITTT, pp. 198-209.*

Blunno, I. et al., Handshake protocols for De-synchronization. In Proceedings of the IEEE International Symposium on Advanced Research in Asynchronous Circuits and Systems (ASYNC), p. 149-158, 2004.

Cortadella, J. et al., Coping with the variability of combinational logic delays. In Proceedings of the IEEE International Conference on Computer Design, p. 505-508, Oct. 2004.

(Continued)

*Primary Examiner* — Leigh Garbowski
(74) *Attorney, Agent, or Firm* — Cooley LLP

(57) ABSTRACT

A computer readable storage medium includes executable instructions to receive a specification of a combinational logic circuit. The specification of the combinational logic circuit is converted to a Single-Rail un-encoded circuit and a Dual-Rail encoded circuit, which periodically encodes a null value, a first valid state and a second valid state on two wires. A logic operation of the Single-Rail un-encoded circuit transpires during processing of a null value by the Dual-Rail encoded circuit.

14 Claims, 13 Drawing Sheets

OTHER PUBLICATIONS

Kondratyev, A. et al., Design of asynchronous circuits by synchronous CAD tools. In Proceedings of the ACM/IEEE Design Automation Conference (DAC), Jun. 2002. pp. 2-12.

Sparso, J. et al., Delay-insensitive multi-ring structures. Integration, the VLSI journal, vol. 15 No. 3 p. 313-340, Oct. 1993.

Sparso, J. et al., Principles of Asynchronous Circuit Design: A Systems Perspective. Kluwer Academic Publishers, 2001 contents and abstracts of sections I-III.

Verhoeff, T., Delay-insensitive codes—an overview. In Distributed Computing, vol. 3 No. 1, 1988 pp. 1-8.

\* cited by examiner

APPARATUS AND METHOD FOR MIXED SINGLE-RAIL AND DUAL-RAIL COMBINATIONAL LOGIC WITH COMPLETION DETECTION

FIELD OF THE INVENTION

This invention relates generally to the design and implementation of digital circuits. More particularly, the invention provides a method and a circuit architecture for transforming a high-level, Boolean specification of a combinational logic circuit to an implementation structure composed of a Single-Rail segment, i.e. gate-level un-encoded digital logic, and a Dual-Rail segment, i.e. two-wire encoded gate-level logic with completion detection.

BACKGROUND OF THE INVENTION

A combinational circuit with the capability of detecting the completion of its operation exhibits the very important advantage of data-dependent input to output delay. Thus, compared to conventional, fixed-delay counterparts, where the delay is either modeled through the use of a global, fixed frequency clock, or by using a fixed delay reference, if the circuit is without a clock, it is capable of operating without the constraint of a fixed, worst-case critical path. Instead, a clock-less circuit operates with a variable critical path based on the gates that are sensitized for a given input vector. This allows the circuits to operate with an average case delay, i.e. a delay proportional to the average case of a specific input data sample composed of a large collection of operational input vectors. This allows circuits with completion detection to have increased performance.

Circuits with completion detection possess three fundamental implementation requirements, i.e. a data encoding scheme, two-phase alternating NULL/DATA operation, and monotonic transitions at all of the circuit components. The data encoding scheme must contain: (i) a code word for an EMPTY or NULL or SPACER value, which typically designates an empty channel, i.e. data absent at a specific circuit portion, and (ii) VALID code words which represent the presence of binary signal values (e.g. "0" or "1" for a single bit value), which typically designates a full channel, i.e. data arrival of a particular value at a specific circuit portion. The two-phase operation is required to prevent data interference between the VALID and NULL code words. Thus, the typical operation of circuits with completion detection is to alternate between NULL and VALID code words at the inputs by observing an acknowledgement, synchronization signal, which is typically communicated by a sequential (state storing) circuit. This ensures that the VALID word is generated by reading the completion signal and is stored in a sequential register. Monotonic operation or monotonic transition implies that any circuit node during a VALID code word propagation is either rising or falling, and ultimately stabilizes to a high or a low voltage without any change in the direction based on circuit delays, gate switching order or hazards. The propagation of the NULL word is merely used to reset all the circuit nodes to their NULL state in order to ensure monotonic operation.

Thus, the typical mode of operation of a circuit with completion detection is the following. First, all of the circuit's nodes are reset to the NULL codeword by feeding NULL to the inputs. Next, a VALID code word is applied. Thus, based on the polarity of the gates, some nodes will be rising while others will be falling. After the VALID computation is complete, a new NULL word is introduced to clear all the circuit's nodes. The application of the NULL word achieves the opposite effect to the prior VALID codeword, i.e. if a node rose to high, now it will typically return to low, and vice versa. The most common encoding scheme for implementing circuits with completion detection is the Dual-Rail encoding scheme. The Dual-Rail encoding scheme encodes at least three values, i.e. NULL, VALID0 and VALID1 using two wires. Typically, NULL is encoded as the digital representation 00, whereas VALID0 and VALID1 are typically encoded as 10 and 01, respectively. In Dual-Rail conversion approaches, where negative polarity gates are allowed for the Dual-Rail implementation, NULL typically possesses two encodings, i.e. 00 or 11, based on the polarity of a node, positive or negative respectively.

There are three fundamental drawbacks with Dual-Rail encoded circuit implementations: (i) area overhead, (ii) power consumption overhead and (iii) cycle time overhead. The first drawback stems from the necessity to generate logic gates for both rails instead of just one, as in binary logic. The second drawback stems from the additional logic for the two rails and the two-phase operation. Both factors significantly increase the number of transitions for a circuit cycle. The third drawback stems from the two-phase operation, where the cycle time of the Dual-Rail circuit is the sum of the delay of the VALID propagation and the delay of the NULL propagation. The combined delay is potentially larger than that of a binary, i.e., un-encoded, circuit.

In view of the foregoing, it would be desirable to develop techniques to overcome shortcomings associated with prior art circuits incorporating completion detection.

SUMMARY OF THE INVENTION

The invention includes a computer readable storage medium with executable instructions to receive a specification of a combinational logic circuit. The specification of the combinational logic circuit is converted to a Single-Rail un-encoded circuit and a Dual-Rail encoded circuit, which periodically encodes a null value, a first valid state and a second valid state on two wires. A logic operation of the Single-Rail un-encoded circuit transpires during the processing of a null value by the Dual-Rail encoded circuit.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings.

DETAILED DESCRIPTION OF THE INVENTION

Figure 1:
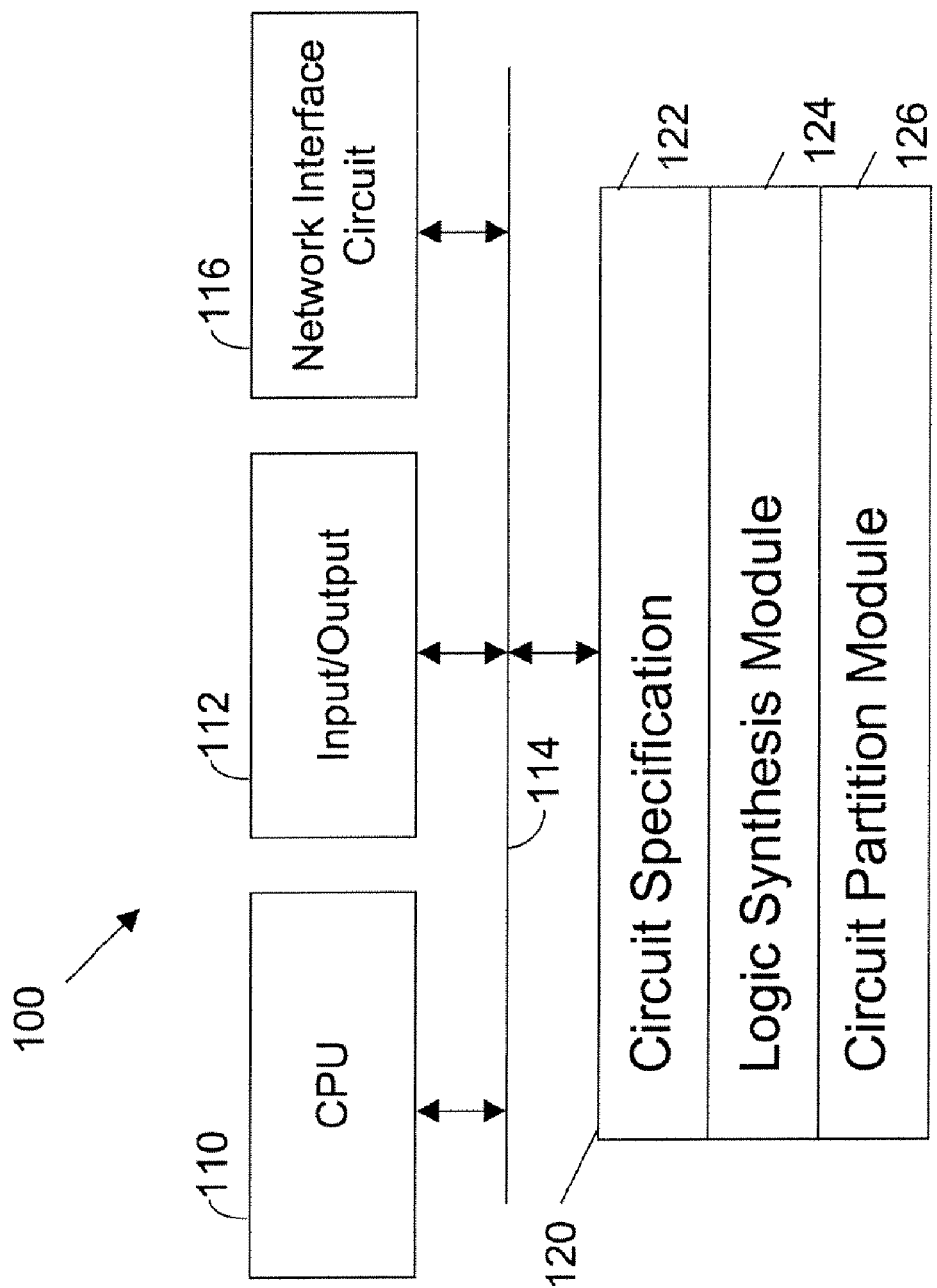
FIG. 1 illustrates a computer configured in accordance with an embodiment of the invention.

FIG. 1 illustrates a computer 100 configured in accordance with an embodiment of the invention. The computer 100 includes standard components, such as a central processing unit 110 and input/output devices 112 connected via a bus 114. The input/output devices 112 may include a keyboard, mouse, display, printer and the like. A network interface circuit 116 is also connected to the bus 114 to provide connectivity to a network (not shown).

A memory 120 is also connected to the bus 114. The memory includes executable instructions to implement operations of the invention. In one embodiment, the memory 120 stores a circuit specification 122 that is processed and transformed in accordance with the invention. The circuit specification 122 is typically a Boolean logic characterization of a Single-Rail un-encoded combinational logic circuit. A logic synthesis module 124 provides standard logic synthesis operations to specify a physical implementation of a circuit. However, in accordance with the invention, the logic synthesis module 124 is supplemented with a circuit partition module 126 that includes executable instructions to convert the circuit specification into a combinational logic circuit with a Single-Rail un-encoded circuit and a Dual-Rail encoded circuit. This circuit architecture trades off between a full-scale Dual-Rail (DR) implementation and a full-scale Single-Rail (SR) un-encoded implementation. That is, a portion of the circuit is SR and another portion is DR, thus yielding acceptable solutions between the two extreme cases. This provides benefits of both approaches, while controlling their drawbacks. The key advantages of SR digital logic are (i) acceptable silicon area occupancy and (ii) acceptable power, as its level of switching activity is low, ranging between 20% and 30%, whereas the key disadvantage is fixed, worst-case latency regardless of input vector. On the other hand, the key advantages of the most seldom used DR logic is variable latency data-dependent computation, whereas the key disadvantages are (i) high area overhead compared to SR and (ii) higher power overhead compared to SR.

The invention utilizes SR logic to implement those portions of a circuit that are always evaluated. For example, this may include those portions of a circuit close to the primary inputs. On the other hand, DR logic, allowing for variable delay and providing the completion detection capability, is used for the portion of the circuit that is conditionally evaluated based on the input vector. This is typically the last levels of the circuit close to the primary outputs. In most circuits, this contains paths of different lengths that evaluate outputs as a function of (i) the primary inputs, and (ii) nodes of the first few logic levels which are common to many primary outputs. The invention exploits these characteristics to create a new circuit architecture with mixed SR-DR logic. This architecture includes a SR part, typically for the first levels of combinational logic and of a DR part, typically for generating the primary outputs using multiple, variable latency delay paths sensitized by the primary inputs and the SR intermediate nodes.

Figure 2:
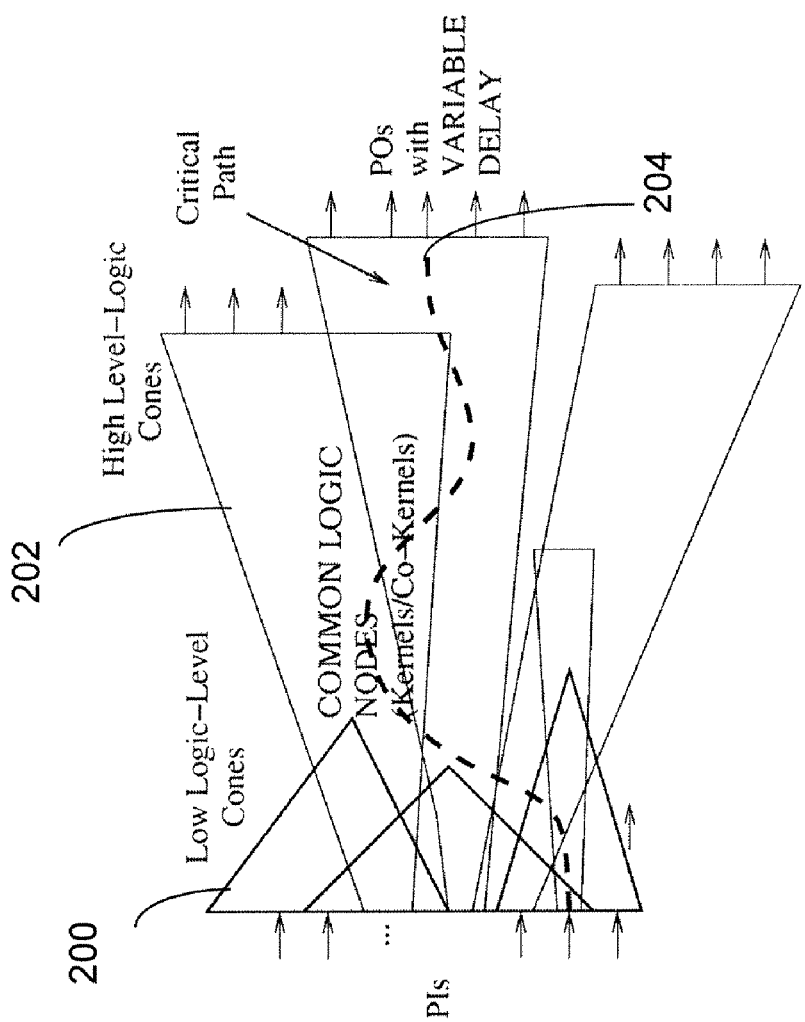
FIG. 2 illustrates logic-level cones associated with a typical combinational logic path.

The partitioning of the SR-DR logic in accordance with the invention is more fully appreciated with reference to FIG. 2. FIG. 2 illustrates a typical structure of digital, static combinational logic. The nodes of the low logic-cones 200, which are typically shared by many paths are good candidates for the SR part of the circuit. That is, these areas of the circuit remain Boolean, un-encoded logic and their delay is modeled by a delay reference. In contrast, the nodes of the high level logic-cones 202 are good candidates for the DR part of the circuit. These cones represent nodes that belong to the longest circuit paths. The critical path 204, i.e. the longest path in terms of delay, is also shown to illustrate that this path will not necessarily be sensitized at every operation of the circuit.

The mixed SR-DR architecture possesses a mode of operation that aims to hide the NULL or RESET phase of the DR part. This is accomplished by overlapping the operation of the SR part of the logic with the NULL phase of the DR logic for the resetting of the prior DATA evaluation. Thus, the sequencing of the mixed SR-DR circuit is as follows, taking as a point of reference, the storage of DATA in the sequential elements at its outputs: (1) DATA, which may be both SR or DR are stored at the sequential elements, (2) the handshaking mechanism, through the ACKNOWLEDGEMENT signal informs the prior stage that new data can be fed to the primary inputs of the next stage, (3) the resetting phase of the DR logic begins, i.e. NULL word propagation using a reset signal, and the SR logic will begin evaluation as soon as new data are available and the REQUEST signal's arrival begins traversing through the SR Delay Reference, (4) when the SR logic has completed its operation and the DR logic has completed its NULL propagation, the DR logic can begin its evaluation, (5) the SR primary outputs availability is signaled by the delay reference; when these are available and all of the DR logic's outputs are also available, as signaled by the DR completion tree, all outputs are available and step (1) can be executed again, i.e. DATA storage. By using the mode of operation presented, the mixed SR-DR circuit achieves average-case, data-dependent actual performance, faster than full scale DR due to its overlapped NULL or reset phase, and faster than the fixed, worst-case predicted SR delay. In addition, there is reduced area consumption compared to a full-scale DR circuit.

Figure 3:
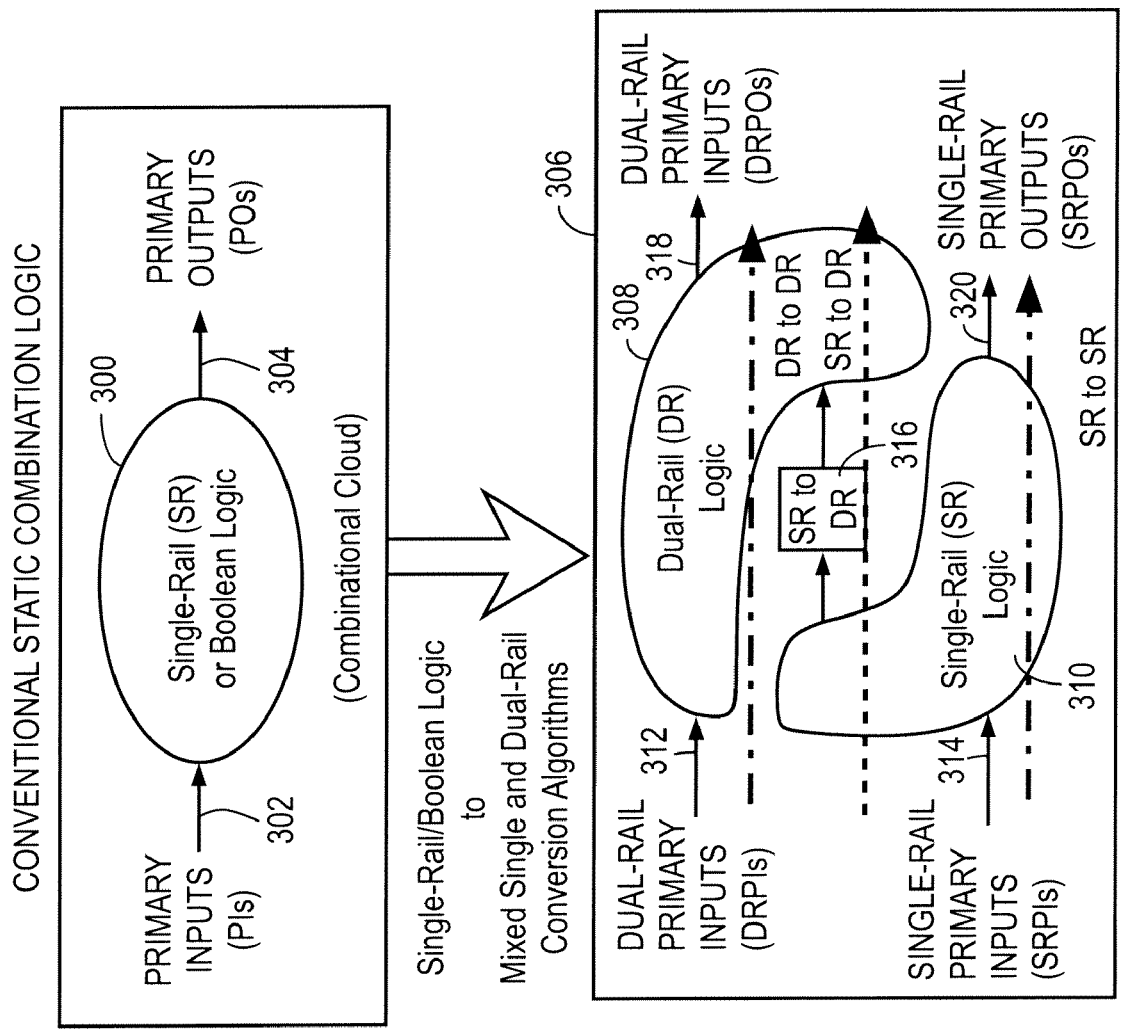
FIG. 3 illustrates the transformation of an original Boolean logic circuit to a Single-Rail/Dual-Rail architecture in accordance with an embodiment of the invention.

FIG. 3 illustrates the transformation process from the original Boolean logic circuit to the SR-DR architecture of the invention. A Single-Rail implementation of a circuit 300 with primary inputs 302 and primary outputs 304 is transformed into a partitioned circuit 306 with Dual-Rail logic 308 and Single-Rail logic 310. Dual-Rail primary inputs (DRPIs) 312 are applied to the Dual-Rail logic 308, while Single-Rail primary inputs (SRPIs) 314 are applied to the Single-Rail logic. SR-to-DR logic or interface 316 operates to receive signals from the Single-Rail synchronous logic, reformat the signals and apply them to the Dual-Rail asynchronous logic. The Dual-Rail logic generates Dual-Rail primary outputs (DRPOs) 318, while the Single-Rail logic generates Single-Rail primary outputs (SRPOs) 320.

Figure 4:
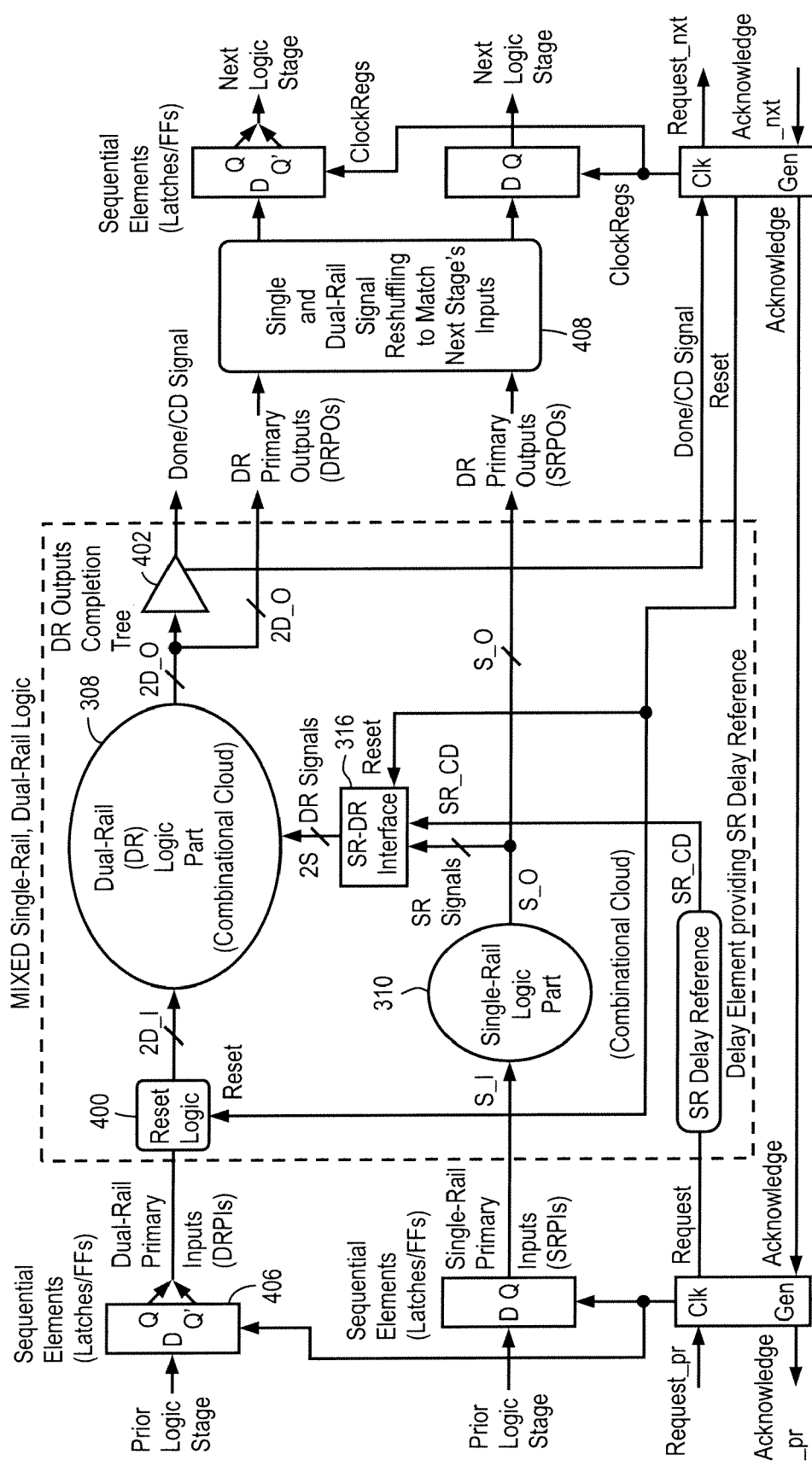
FIG. 4 is a detailed characterization of a Single-Rail/Dual-Rail circuit configured in accordance with an embodiment of the invention.

FIG. 4 is a more detailed characterization of the architecture of FIG. 3. The figure illustrates the Dual-Rail logic 308 and the Single-Rail logic 310 linked by the SR-DR interface 316. RESET logic 400 returns the DR inputs to an all zero vector when the RESET signal is asserted, i.e. the NULL value. The SR-DR interface 316 converts the SR signals to DR signals upon completion of the SR part and also resets the SR-DR inputs. The DR outputs completion tree 402 may be implemented as a level of OR gates, one per DRPO, for detecting PO completion, followed by an AND tree yielding the DONE signal for the entire DR block, which is then connected to the REQUEST input of a clock generating element, CLKGEN 404. The DR inputs are generated by FFs or Latches with Q and Q' outputs 406, so that the TRUE and FALSE rails of a signal appear simultaneously. As the SR and DR portions vary from one logic stage to the next, a reshuffling block 408 reroutes the signals to group them into the SR and DR portions for the next stage. This block does not contain any logic and is only required when an SR-DR cloud is followed by another SR-DR cloud.

Figure 5:
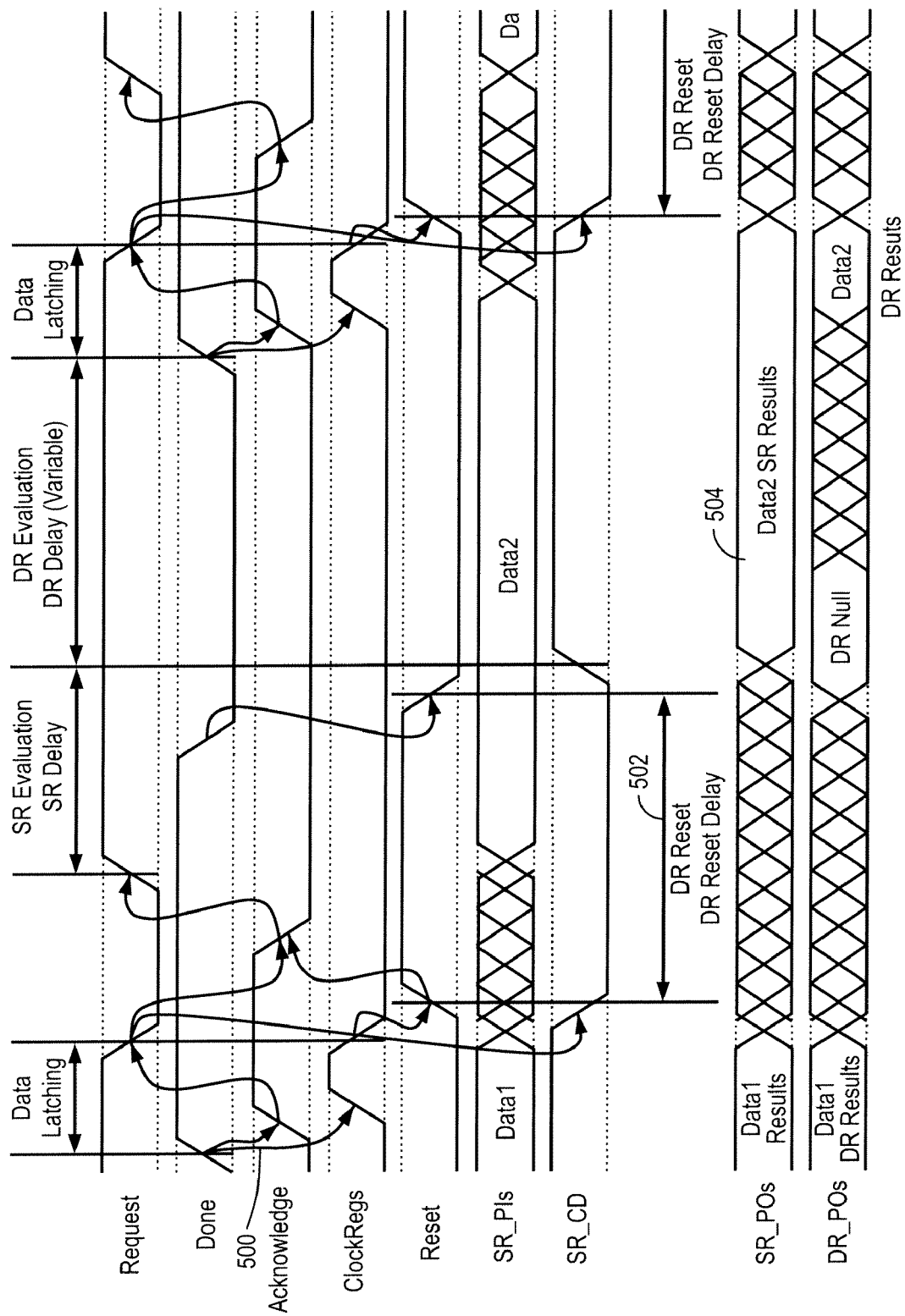
FIG. 5 is a timing diagram illustrating operational modes associated with embodiments of the invention.

FIG. 5 shows a detailed timing diagram for the circuit of FIG. 4. The Figure illustrates how the DONE and ACKNOWLEDGE signals are related to the generation of the local clock, CLOCKREGS (see arrows 500). The Figure also illustrates how the SR Evaluation overlaps in time with the DR resetting phase (see arrow 502). In addition, the figure shows how the SR and DR results are generated in time and are eventually latched in the sequential elements that succeed the SR-DR logic cloud. In particular, observe that single rail data results 504 are generated during the null phase of the Dual-Rail circuit.

Figure 6:
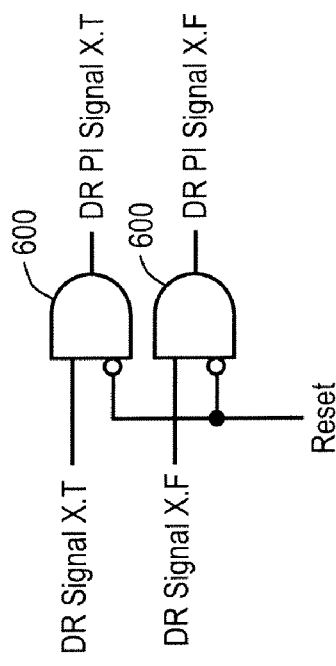
FIG. 6 illustrates an implementation of RESET logic for a Dual-Rail signal.

FIG. 6 illustrates exemplary logic to implement the RESET block 400 of FIG. 4. The Figure includes logical AND gates 600 whose output toggles in response to the assertion of the RESET signal.

Figure 7:
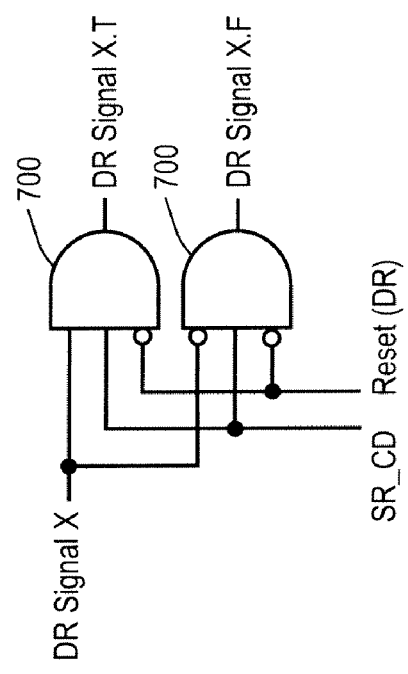
FIG. 7 illustrates an implementation of a Single-Rail/Dual-Rail interface for a Single Rail signal.

FIG. 7 shows an example of the implementation of the SR-DR interface 316 for an SR signal X. The SR signal X is converted to a DR signal when SR_CD is asserted. However, if the DR RESET is high, the DR input is a NULL word since the AND gates 700 are driven low.

Figure 8:
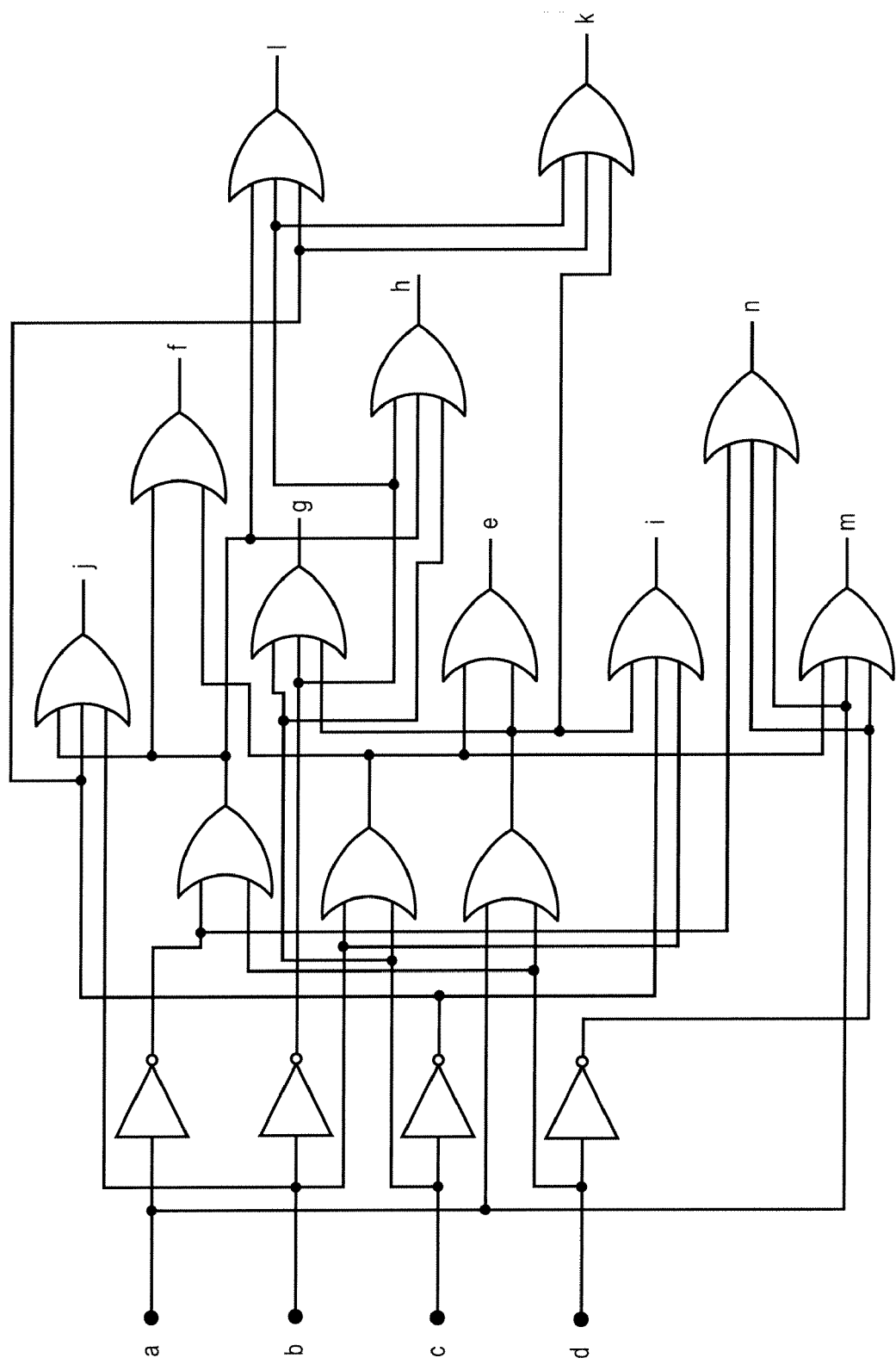
FIG. 8 illustrates an original combinational logic circuit processed in accordance with an embodiment of the invention.
Figure 9:
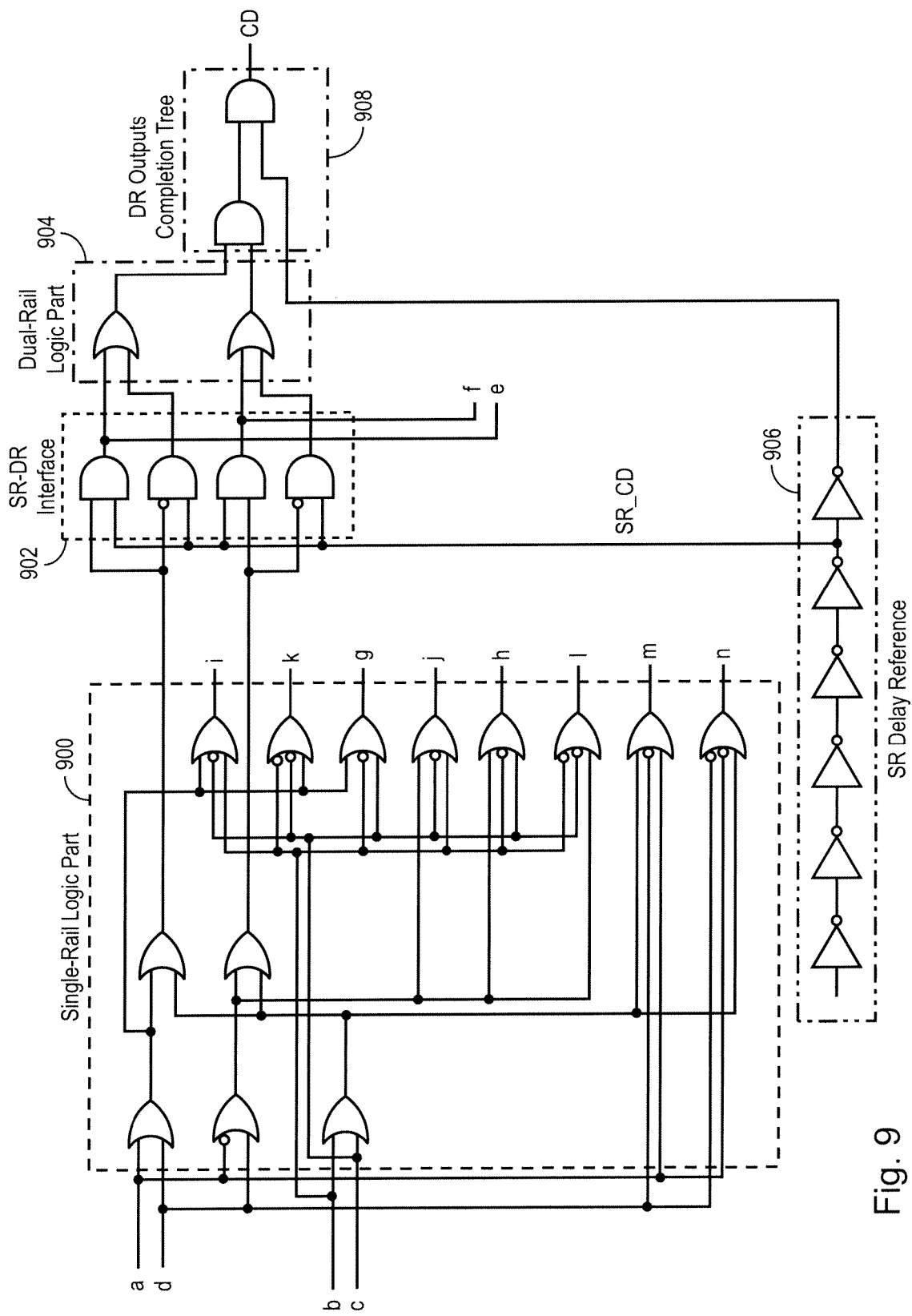
FIG. 9 illustrates a Single-Rail/Dual-Rail circuit derived from the circuit of FIG. 8 in accordance with an embodiment of the invention.

FIG. 8 and FIG. 9 illustrate a detailed, gate-level conversion for a circuit from its original, conventional, full SR gate-level implementation, shown in FIG. 8, into an SR-DR gate-level implementation in FIG. 9. FIG. 9 identifies the portion of the logic which has remained SR 900, the SR-DR interface gates 902, a simple SR Delay Reference 906 composed of an inverter chain, the DR portion 904 of the logic and the DR Outputs completion tree 908.

Figure 10:
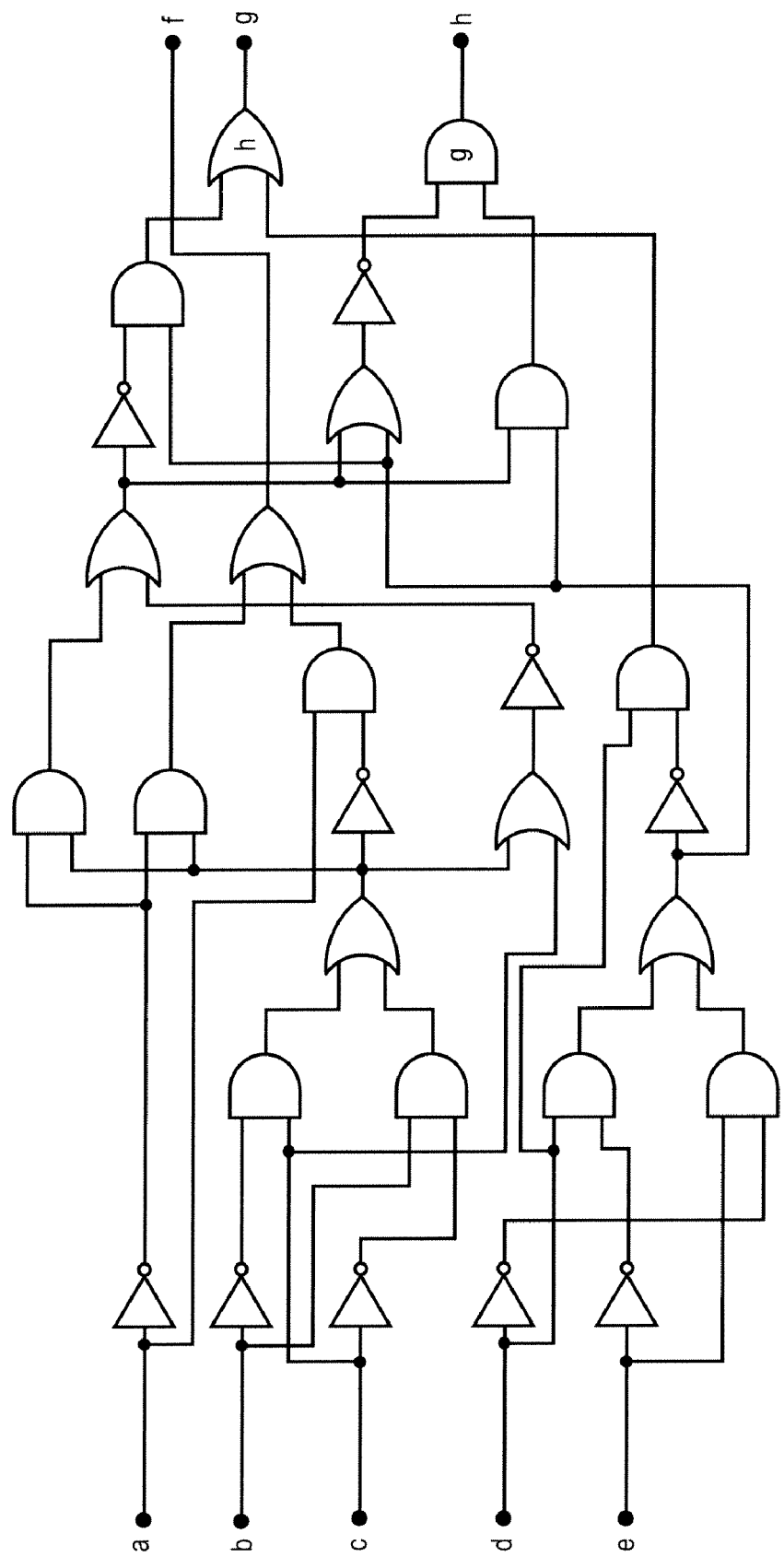
FIG. 10 illustrates an original combinational logic circuit processed in accordance with an embodiment of the invention.
Figure 11:
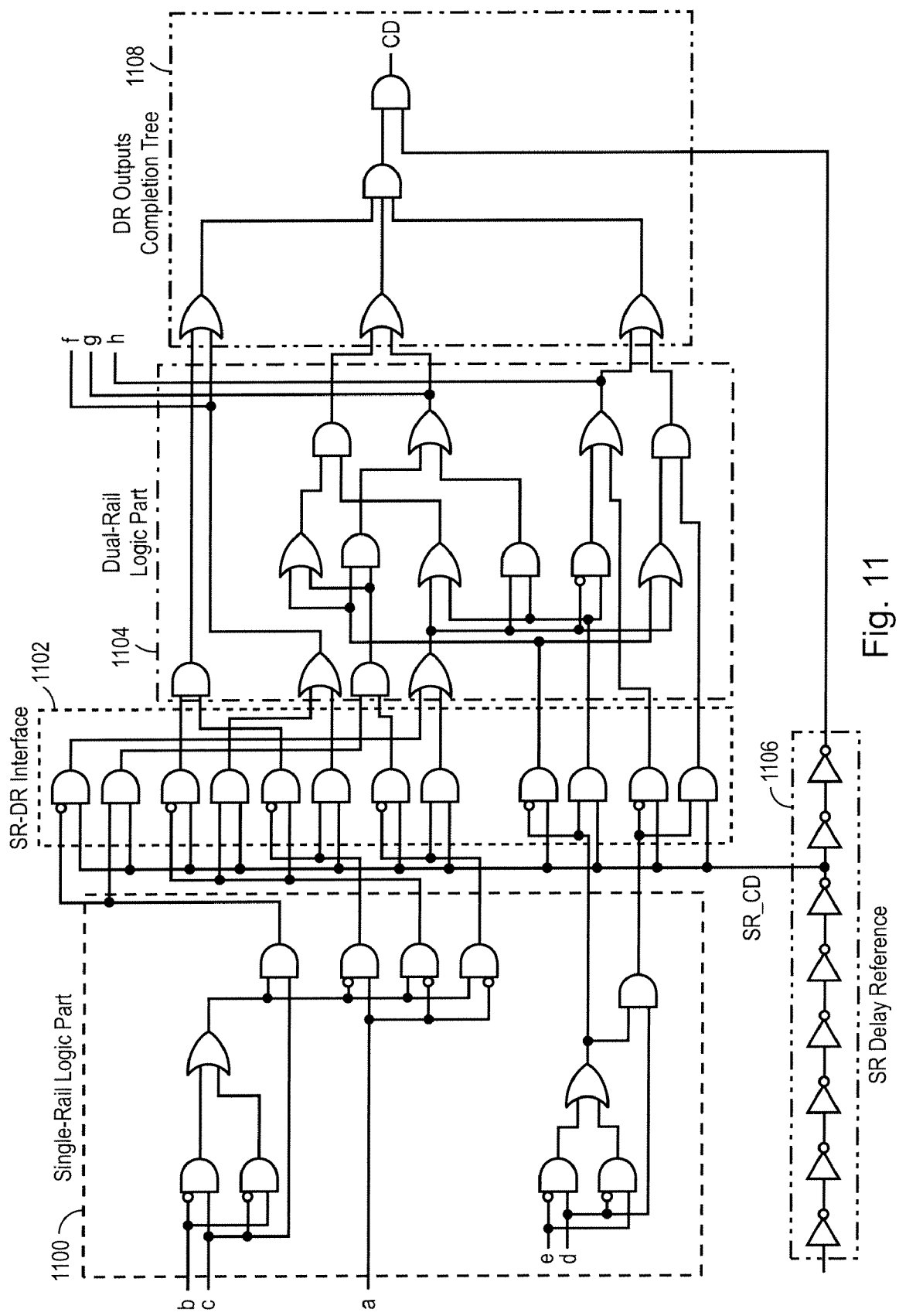
FIG. 11 illustrates a Single-Rail/Dual-Rail circuit derived from the circuit of FIG. 10 in accordance with an embodiment of the invention.

FIG. 10 illustrates a synchronous combinational logic circuit that is converted into the mixed Single-Rail/Dual-Rail circuit of FIG. 11. FIG. 11 includes a Single-Rail un-encoded segment 1100, an SR-DR interface 1102, a Dual-Rail encoded segment 1104, a Single-Rail delay reference 1106 and output completion logic 1108.

Figure 12:
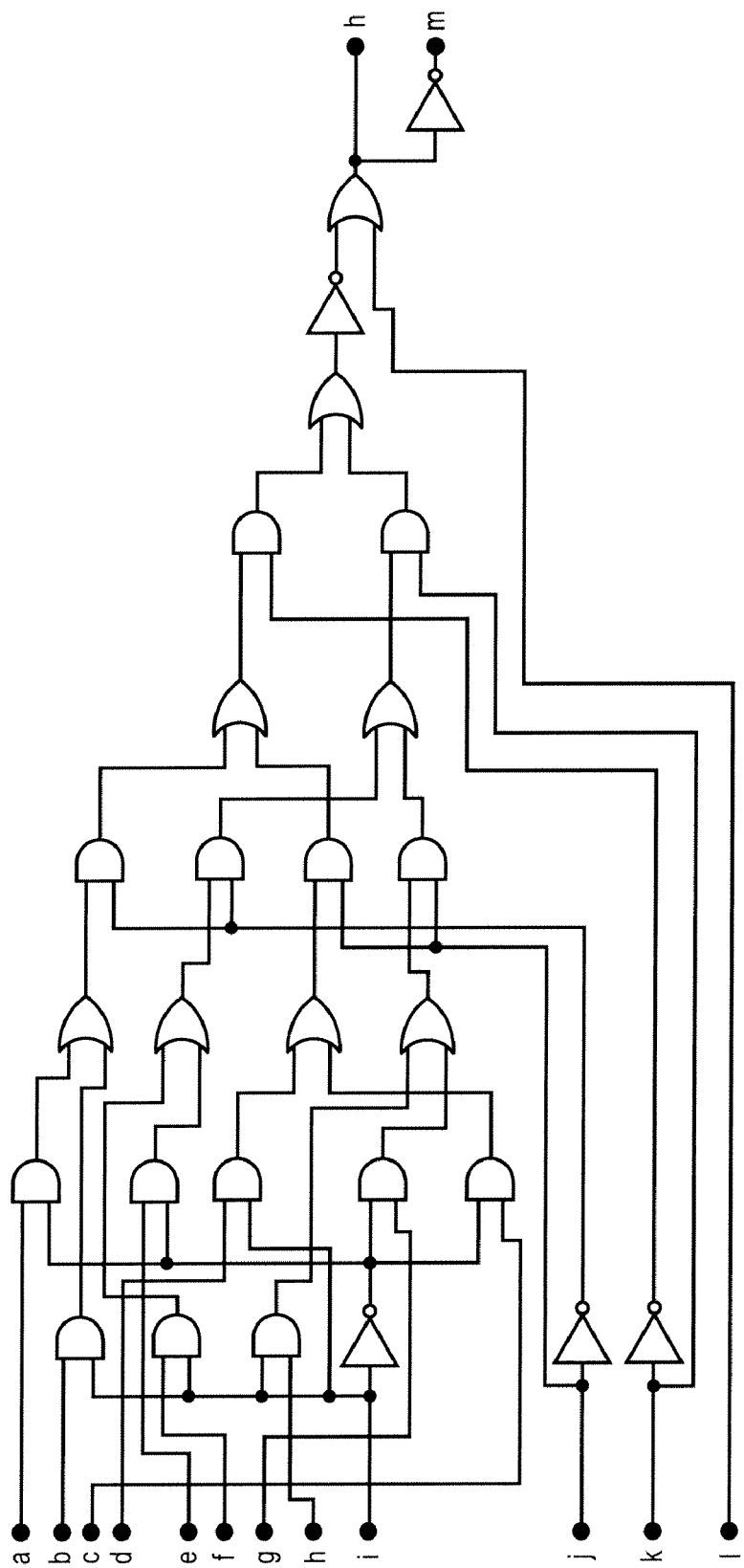
FIG. 12 illustrates an original combinational logic circuit processed in accordance with an embodiment of the invention.
Figure 13:
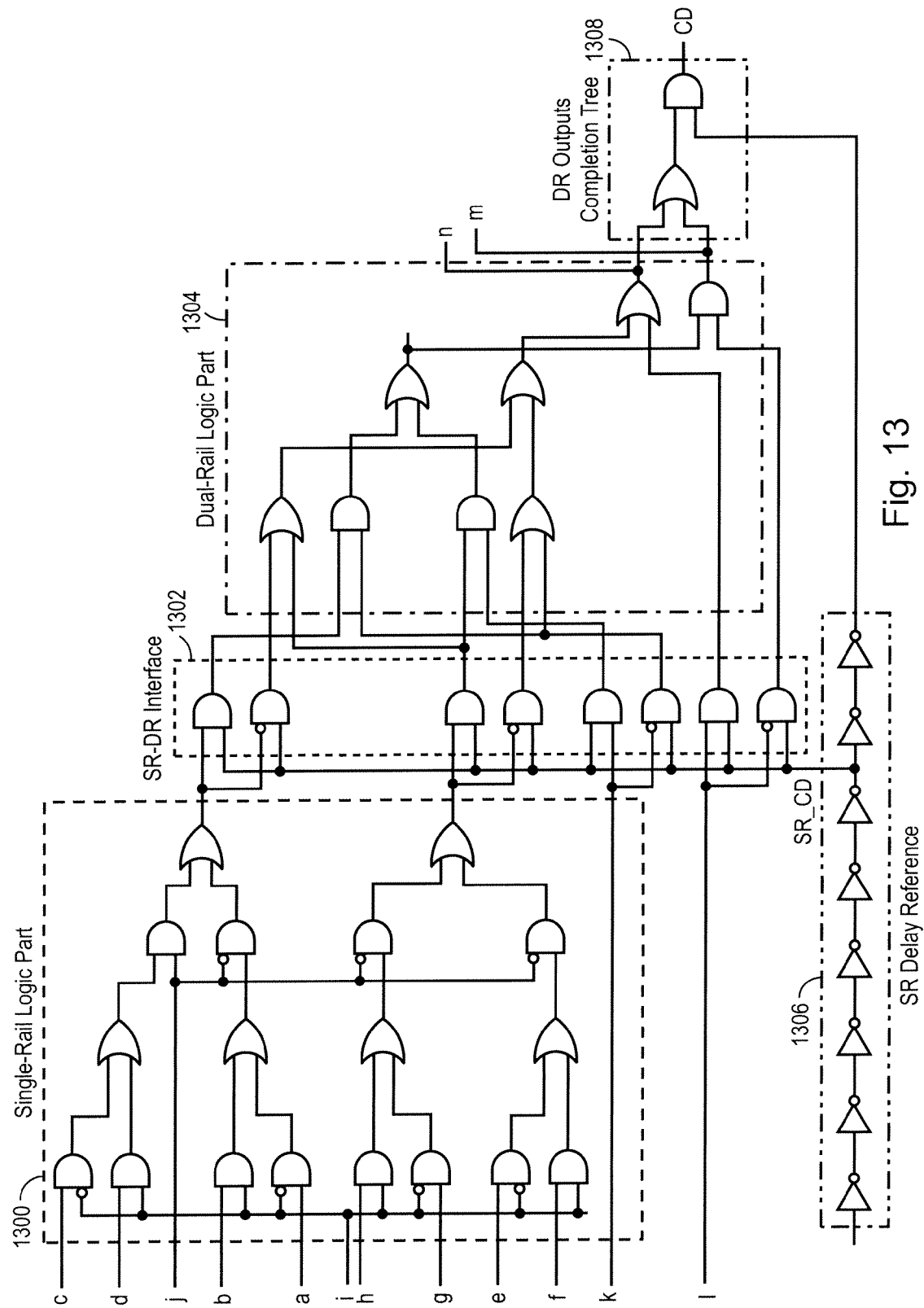
FIG. 13 illustrates a Single-Rail/Dual-Rail circuit derived from the circuit of FIG. 12 in accordance with an embodiment of the invention.

Similarly, FIG. 12 illustrates a combinational logic circuit that is converted into a mixed Single-Rail/Dual-Rail circuit of FIG. 13. FIG. 13 includes a Single-Rail un-encoded segment 1300, an SR-DR interface 1302, a Dual-Rail encoded segment 1304, a Single-Rail delay reference 1306 and output completion logic 1308.

As shown in the figures, the mixed SR-DR circuits include: (i) a SR Delay Reference, mimicking the worst-case, fixed delay of the SR part, (ii) an SR-DR interface that converts the outputs of the SR logic into DR equivalent signals, (iii) RESET logic for the DR part, (iv) a completion detection network for the DR outputs, (v) appropriate clock-less or clocked logic capable of storing the mixed SR-DR logic results to sequential elements, e.g. registers and (vi) shuffling logic, which converts the outputs of SR-DR logic into an SR group and a DR group suitable for feeding to one or more mixed SR-DR logic portions, if necessary.

Attention now turns to various implementations of these components. The SR delay reference is a delay element with equivalent delay and maximum delay correlation to the worst-case, fixed delay of the SR portion. As shown in FIGS. 9, 11 and 13, the delay reference may be implemented as a set of inverters.

The SR-DR interface is a converted circuit with two functions. During the DR's RESET phase, i.e. when the reset signal is asserted, it should keep all DR primary inputs at NULL, i.e. X.T=0 and X.F=0, for any DR signal X, and when the SR circuit has completed its evaluation and the DR circuit exits its RESET phase, it should convert all SR outputs to DR inputs, i.e. an SR signal x should become a DR signal x.t and x.f, with the appropriate values. In one embodiment, the RESET logic for the DR part is a set of AND gates 600 (illustrated in FIG. 6), which, when the reset signal is asserted, imposes the NULL word, i.e. X.T=0, X.F=0, for any DR PI signal X.

In one embodiment, the completion detection network is composed of two parts: a completion OR gate at the output of every DR output signal (see, e.g., FIGS. 11 and 13), which if asserted indicates completion of that particular signal, as it has arrived at a TRUE or FALSE value, and a completion tree, which should assert the DONE/CD signal when all DR primary outputs have assumed a final value. In FIGS. 9, 11 and 13 a logical AND gate is used to test this condition.

The intention of the presented SR-DR architecture is not to convert all combinational logic clouds of a circuit to their SR-DR equivalents with completion detection, as the overall area and power overhead at the system level could exceed reasonable limits. The intention is to selectively convert the most critical combinational logic clouds into the SR-DR architecture, where a performance gain is not attainable by other conventional methods. Thus, by converting only selected portions of the circuit, the area and power overhead can be controlled at a low level.

The following operations implement the mixed SR-DR circuit. Beginning from the Boolean Logic specification of the logic function, make a decision on the SR-DR partitioning based on (i) the area overhead of the mixed SR-DR logic, compared to a full SR conventional implementation, (ii) the variation of logic levels for the DR part, this property is called the DR circuit's elasticity and is defined as the difference between the slowest DR path and the fastest DR path, for a given DR primary output, and (iii) the difference between the fixed SR delay in logic levels and the worst-case DR delay in logic levels, which is called the SR-DR circuit's balance.

The partitioning can be implemented as part of any logic synthesis system that allows for the circuit specification to be specified in the Boolean Level and is capable of technology-mapping the gates to a standard-cell static, digital logic technology library in order to fulfill timing, area and power goals and constraints. The invention can be used to implement one or more logic clouds of a digital design into a mixed SR-DR circuit at the logical level or at the technology-mapped level.

In one embodiment a method entitled Single_Rail_Node_Selection assumes as input the Boolean Network (BN) and a Maximum Logic Level for the SR logic, LL. The technique allocates the Boolean circuit's nodes which have a logic level less than LL to a SR Nodes list.

A second method entitled Dual_Rail$_{13}$ Node_Selection is executed after the first method. The second method allocates any remaining, i.e. non SR Boolean nodes to a DR Nodes list.

The first method is preferably executed with a levelized Boolean Network as input. This could be accomplished by a simple mapping of the Boolean Equations to AND/OR gates with a fixed number of inputs, e.g. 2 or 3, in order to allocate logic levels to every Boolean Network node. The outputs of the two methods can then be processed to compose the mixed SR-DR circuit. In particular, the following operations can be performed: (i) DR conversion for the nodes which reside in the DR Node list, (ii) introduce the RESET and SR-DR Interface logic, (iii) build the completion tree for the DR primary outputs and (iv) create and introduce the SR Delay Reference. Having generated the complete mixed SR-DR circuit, it must also be interfaced to appropriate clock-less or clocked logic, which implements the mode of operation described above, i.e. store data to sequential elements and drive the RESET signal appropriately. An excellent candidate for this logic is de-synchronization logic, which allows for the implementation of clock generators, feeding from the DONE/CD signal.

```
Single_Rail_Node_Selection(BN, LL)
// BN: Boolean Network, LL: Logic Level //
  1.  {
  2.      SRNodesList = getPIs(BN); // add Primary Inputs
                         (PIs) to the Single-Rail nodes list //
  3.      for all node in SRNodesList    // traverse nodes from PIs //
  4.      {
  5.          for all fanout in Fanout(node) // traverse following
                  fanout of nodes //
  6.          {
  7.              if (Fanin(fanout) in SRNodesList) and
                     (fanout not in SRNodesList)
  8.              {
  9.                  if (LogicLevel(fanout) < LL)
 10.                      AddNode(fanout, SRNodesList);
 11.                      // add node if its logic level
                              is less than LL //
 12.              }
 13.          }
 14.      }
 15.      return SRNodesList;
 16.  }
Dual_Rail_Node_Selection(BN, SRNodesList)
// BN: Boolean Network, SRNodesList: List of Single-Rail
nodes calculated using Algorithm 1 //
  1.  {
  2.      DRNodesList = 0; // empty Dual-Rail nodes list //
  3.      for all node in getNodes(BN) // check all nodes
             of the Boolean network //
  4.      {
  5.          if (node not in SRNodesList)
  6.          {
  7.              AddNode(node, DRNodesList);
                  // add node to DR nodes //
  8.          }
  9.      }
 10.      return DRNodesList;
 11.  }
```

Logic can be used to appropriately derive the number of logic levels that are appropriate for partitioning the Boolean Network into SR and DR parts based on a specific area overhead provided by the user. Exemplary logic, referred to as Area_based_SR_DR_Partitioning is provided below. It repetitively calls the first and second methods in order to identify the appropriate number of logic levels that divide the circuit in such a way as to incur the required overhead within a given error margin. The logic operates by setting an upper and a lower bound on the logic levels, which may respectively begin with the maximum number of logic levels of the Boolean Network and zero. Then, it estimates the area overhead for the mid-point between the two bounds based on whether the area, in literal number, is larger or smaller, and readjusts one of the two bounds to half of the difference. In this way, the algorithm converges to a logic level value that incurs the desired target area overhead.

```
Area_based_SR_DR_Partitioning(BN, TargetArea, Error)
// BN: Boolean Network, Error: Error margin for
achieving the required Area //
//  TargetArea: Area overhead of SR-DR circuit compared to a full SR
implementation in Literals //
  1.  {
  2.      UpperLL = getMaxLogicLevel(BN); // set maximum
             logic level of BN as upped bound //
  3.      LowerLL = 0; // set 0 logic levels are lower bound //
  4.      currentLL = (UpperLL - LowerLL)/2;
  5.      do {
  6.          SRNodes =
                 Single_Rail_Node_Selection(BN, currentLL);
  7.          DRNodes =
                 Dual_Rail_Node_Selection(BN, SRNodes);
  8.          Area = getLiterals(SRNodes) + getLiterals(DRNodes);
  9.              // compute area by using literal count //
 10.             // the area of additional circuit structures,
                 e.g. SR/DR interface //
 11.             // or reset logic could be approximated as well for
                 better accuracy //
 12.         if (Area > TargetArea)
 13.         {
 14.             UpperLL = UpperLL;
 15.             LowerLL = (UpperLL -
                     LowerLL)/2; // change lower bound //
 16.         }
 17.         else
 18.         {
 19.             UpperLL = (UpperLL -
                     LowerLL)/2; // change upper bound //
 20.             LowerLL = LowerLL;
 21.         }
 22.         currentLL = (UpperLL - LowerLL)/2;
 23.     }
 24.     while (Area < TargetArea) and ((TargetArea - Area) <
             Error)
 25.     return currentLL;
 26.  }
```

This processing relies solely on the notion of logic levels. The processing performs SR-DR partitioning based on this heuristic and can be improved further by taking into account a number of additional circuit parameters, specifically the logical or Boolean structure of the circuit. These parameters may include: (i) timing overhead; the elasticity of the circuit, i.e. the difference between the slowest path of the DR part and the fastest path of the DR path is a good optimization metric to improve the overall circuit's timing, (ii) the circuit's kernel or co-kernel Boolean expressions can be used instead of the logic levels to derive nodes which should be implemented in SR, as kernels and co-kernels are nodes which are close to the primary inputs and most paths will traverse them, (iii) the transitive fan-out of nodes is another possible approach, once the SR nodes have been decided, to compute the complementary DR nodes and (iv) different gates of the same level could also be evaluated as SR candidates, so as to increase the asymmetry between the SR and DR circuit portions.

Figure 14:
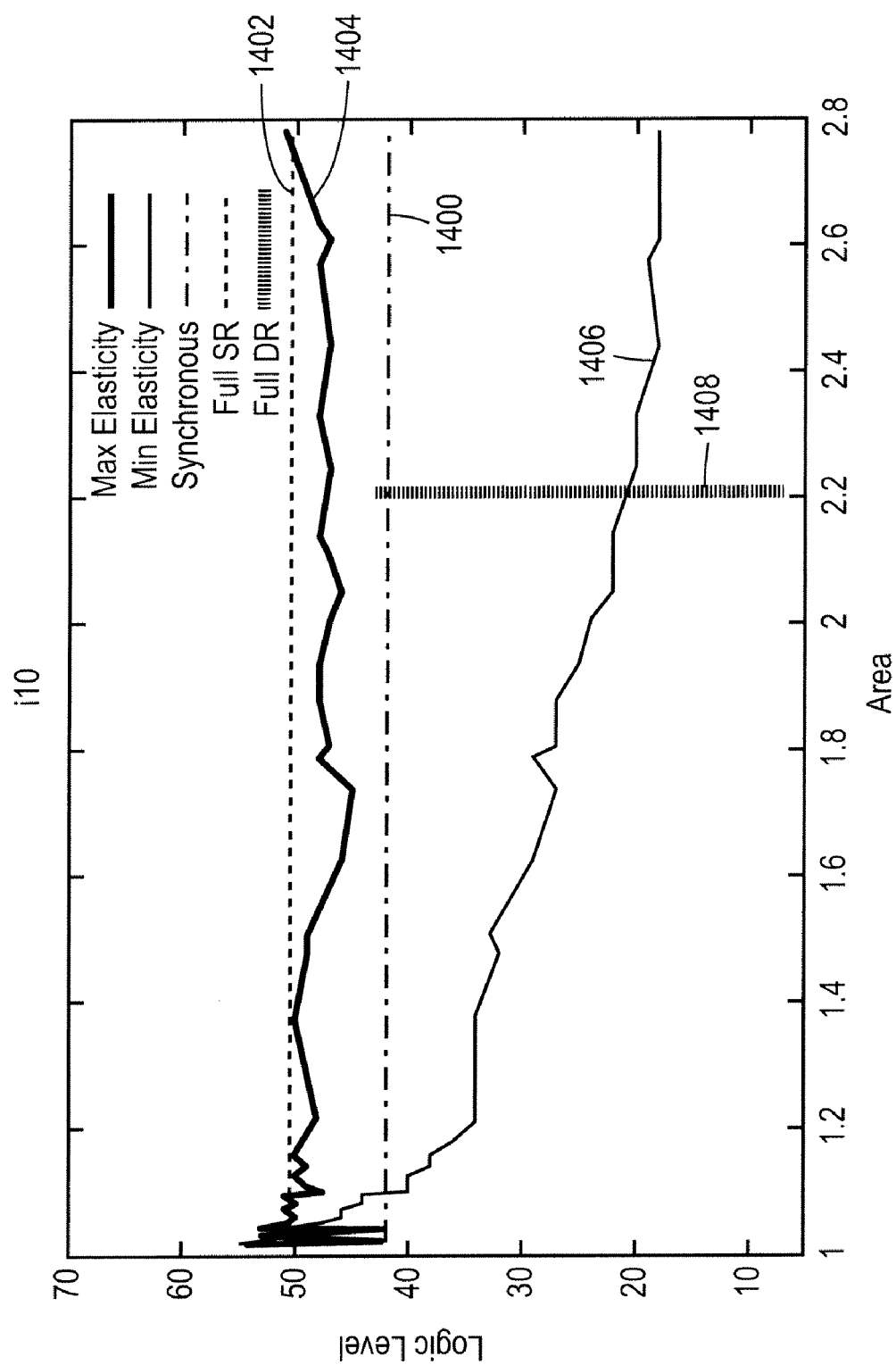
FIG. 14 illustrates area/elasticity tradeoffs achieved in accordance with an embodiment of the invention.

FIG. 14 illustrates results from the execution of the techniques of the invention on a circuit (i10). The graph is an Area/Delay graph, where Delay is expressed in logic levels. The horizontal, gray dotted line 1400 represents the delay of the original, full SR gate-level implementation, whereas the black dotted line 1402 on top of it represents the same delay appended with a fixed, safety margin of 20% to account for any mismatches between logic and SR Delay Reference. The two continuous lines 1404 and 1406 represent the maximum and minimum delay for an SR-DR implementation at a given Area overhead on the x-axis. It can be seen that as area increases, the gap between the two, i.e. the elasticity, increases. The vertical dotted line 1408 represents the full DR Area/Delay point.

An embodiment of the present invention relates to a computer storage product with a computer-readable medium having computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs, DVDs and holographic devices; magneto-optical media; and hardware devices that are specially configured to store and execute program code, such as application-specific integrated circuits ("ASICs"), programmable logic devices ("PLDs") and ROM and RAM devices. Examples of computer code include machine code, such as produced by a compiler, and files containing higher-level code that are executed by a computer using an interpreter. For example, an embodiment of the invention may be implemented using Java, C++, or other object-oriented programming language and development tools. Another embodiment of the invention may be implemented in hardwired circuitry in place of, or in combination with, machine-executable software instructions.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

The invention claimed is:

1. A computer readable storage medium, comprising executable instructions to:
   receive a specification of a combinational logic circuit; and
   convert the specification of the combinational logic circuit to a Single-Rail un-encoded circuit and a Dual-Rail encoded circuit, which periodically encodes a null value, a first valid state and a second valid state on two wires,
   wherein a logic operation of the Single-Rail un-encoded circuit transpires during processing of the null value by the Dual-Rail encoded circuit.

2. The computer readable storage medium of claim 1 further comprising executable instructions to evaluate spatial trade-offs between the size of the Single-Rail un-encoded circuit and the size of the Dual-Rail encoded circuit.

3. The computer readable storage medium of claim 2 wherein the executable instructions to evaluate include executable instructions to evaluate the best cycle time for the lowest Single-Rail un-encoded circuit area.

4. The computer readable storage medium of claim 2 wherein the executable instructions to evaluate include executable instructions to:
   receive the specification of the combinational logic circuit and a maximum logic level for the Single-Rail un-encoded circuit; and
   allocate nodes of the specification of the combinational logic circuit that have a logic level less than the maximum logic level to the Single-Rail un-encoded circuit.

5. The computer readable storage medium of claim 4 further comprising executable instructions to allocate remaining nodes of the specification of the combinational logic circuit to the Dual-Rail encoded circuit.

6. The computer readable storage medium of claim 2 wherein the executable instructions to evaluate include executable instructions to identify the appropriate number of logic levels that divide the specification of the combinational logic circuit so as to incur an area overhead value within a specified error margin.

7. The computer readable storage medium of claim 6 further comprising executable instructions to:
   set a maximum number of logic levels and a minimum number of logic levels;
   derive a computed area overhead value for the mid-point between the maximum number of logic levels and the minimum number of logic levels; and
   readjust the maximum number of logic levels or the minimum number of logic levels to one half of the computed area overhead value.

8. A circuit, comprising:
   a combined Single-Rail un-encoded circuit and a Dual-Rail encoded circuit, which periodically encodes a null value, a first valid state and a second valid state on two wires,
   wherein a logical operation of the Single-Rail un-encoded circuit transpires during processing of the null value by the Dual-Rail encoded circuit.

9. The circuit of claim 8 wherein the Single-Rail un-encoded circuit includes a delay reference establishing a worst-case, fixed delay.

10. The circuit of claim 8 further comprising a Single-Rail/Dual-Rail circuit interface to convert outputs from the Single-Rail un-encoded circuit to inputs to the Dual-Rail encoded circuit.

11. The circuit of claim 8 wherein the Dual-Rail encoded circuit includes a reset circuit.

12. The circuit of claim 8 wherein the Dual-Rail encoded circuit includes completion detection circuitry.

13. The circuit of claim 8 further comprising a storage element for mixed Single-Rail/Dual-Rail logic results.

14. The circuit of claim 8 further comprising shuffling logic to convert output from the combined Single-Rail un-encoded circuit and Dual-Rail encoded circuit into a Single-Rail group and a Dual-Rail group for a subsequent circuit stage.

* * * * *